(12) United States Patent
Chen et al.

(10) Patent No.: US 8,296,539 B2
(45) Date of Patent: Oct. 23, 2012

(54) METHOD AND APPARATUS FOR PERFORMING WEAR LEVELING IN MEMORY

(75) Inventors: Liming Chen, Zhuhai (CN); Cheng Chen, Zhuhai (CN)

(73) Assignee: Actions Semiconductor Co., Ltd. (CN)

( * ) Notice: Subject to any disclaimer, the term of this patent is extended or adjusted under 35 U.S.C. 154(b) by 340 days.

(21) Appl. No.: 12/666,073

(22) PCT Filed: Apr. 28, 2008

(86) PCT No.: PCT/CN2008/070835
§ 371 (c)(1),
(2), (4) Date: Dec. 22, 2009

(87) PCT Pub. No.: WO2009/006803
PCT Pub. Date: Jan. 15, 2009

(65) Prior Publication Data
US 2010/0185805 A1 Jul. 22, 2010

(30) Foreign Application Priority Data
Jul. 5, 2007 (CN) .......................... 2007 1 0127453

(51) Int. Cl.
*G06F 12/00* (2006.01)
*G06F 13/00* (2006.01)
*G06F 13/28* (2006.01)

(52) U.S. Cl. ....................................... 711/165; 711/103

(58) Field of Classification Search ................. 711/103, 711/165
See application file for complete search history.

(56) References Cited

U.S. PATENT DOCUMENTS

| | | | |
|---|---|---|---|
| 6,230,233 B1 * | 5/2001 | Lofgren et al. | 711/103 |
| 6,831,865 B2 * | 12/2004 | Chang et al. | 365/185.33 |
| 6,973,531 B1 * | 12/2005 | Chang et al. | 711/103 |
| 6,985,992 B1 | 1/2006 | Chang et al. | |
| 7,139,863 B1 | 11/2006 | Defouw et al. | |
| 2004/0083335 A1 | 4/2004 | Gonzalez et al. | |
| 2007/0103992 A1 | 5/2007 | Sakui et al. | |

FOREIGN PATENT DOCUMENTS

| | | |
|---|---|---|
| CN | 1536489 A | 10/2004 |
| CN | 1701309 A | 11/2005 |
| CN | 1720590 A | 1/2006 |
| CN | 101067800 A | 11/2007 |

\* cited by examiner

*Primary Examiner* — Michael Alsip
(74) *Attorney, Agent, or Firm* — Baker & Hostetler LLP (57) ABSTRACT

A method for performing wear leveling in a memory, and an apparatus corresponding to the method, is provided. The method includes: dividing the lifecycle of the memory which includes more than one physical blocks into at least one sampling interval; for each sampling interval, getting the first physical block by taking statistics of the degree of the wear leveling of each physical block in the memory in the current sampling interval; getting the second physical block by taking statistics of the updating times of each logical address in the current sampling interval; exchanging the logical addresses and data of the first physical block and the second physical block.

12 Claims, 7 Drawing Sheets

METHOD AND APPARATUS FOR PERFORMING WEAR LEVELING IN MEMORY

CROSS-REFERENCE TO RELATED APPLICATIONS

This application is a National Stage of International patent application PCT/CN2008/070835, filed on Apr. 28, 2008, which claims priority to foreign patent application CN 200710127453.0, filed on Jul. 5, 2007.

FIELD OF THE INVENTION

The present invention relates to memory management technology. In particular, the present invention relates to a method and an apparatus for performing wear leveling in a memory.

BACKGROUND OF THE INVENTION

The embedded system is the device or system that is designed to execute special function for special applications and controlled by the internal computer. In recent years, with the fast advancement of the computer science technology and the network communication technology, the development and application of the embedded system have been gaining rapid growth and great popularity. Flash memory storage media is a nonvolatile memory. The Flash memory has features that the internal information can be retained after the Flash memory is power-off and the flash memory can be erased and programmed repeatedly, and the like. Presently, embedded systems using the Flash memory as the storage media are applied widely.

The Flash memory has the following physical properties: when the Flash memory is in the clean situation (it is erased, but the write operation has not been committed), each bit of the Flash memory is 1; each bit of the Flash memory can be set to 0 via the write operation, but it is impossible to set 0 to 1 through the write operation, it must be processed through the erase operation. Generally, the erase operation must be executed with the unit of one Physical Block. The lifetime of the Flash memory is limited, and is determined by the maximum erasable/programmable times of the Physical Block. A Physical Block exceeding its maximum erasable/programmable times becomes a bad Block, and the bad Block can never be used again.

The degree of wear of a memory unit in the Flash memory system is changed according to the erase/program frequency of the memory unit such as the Physical Block. If a memory unit is infrequently erased and programmed, the degree of wear of the memory unit is low. However, if a memory unit is frequently erased and programmed, the degree of wear of the memory unit is high. Because of the inherent properties of the embedded system, the host may repeatedly execute the operation of writing data in the logical address area of a fixed range, and the memory units in the same area in the Flash memory may be repeatedly written and erased. When some memory units become bad units due to exceeding the maximum erasable/programmable times and other memory units are not worn, the general performance of the Flash memory system is decreased because of the present of the bad units. Generally, when there are a lot of bad units in the Flash memory system and the ratio of the bad units is equal to or exceeds the allowable limitation for normal use of the Flash memory system, even though many other memory units in the Flash memory system are not worn, the Flash memory system can not be used anymore. Therefore, in order to avoid some memory units being excessively erased and written, so that these memory units will not reach the maximum erasable/programmable times earlier than the other memory units, the erase and write operation should be distributed uniformly on each memory unit without affecting the system performance. The process is called wear leveling.

According to the conventional wear leveling method, the information of each memory unit, such as the erase/write times, is recorded in a special position in the memory. For example, with respect to the NAND Flash, the information is recorded in a specific spare area configured for each page. According to the erase/write times of each memory unit, the policy may be made between the memory units with more erase/write times and the memory units with less erase/write times. The policy generally relates to exchange physical units corresponding to different logical addresses and exchange data in these physical units, thus implementing the erase/write evenness among the physical units.

SUMMARY OF THE INVENTION

The present invention provides a method and an apparatus for performing wear leveling in a memory, in order to solve the problems of occupying memory resource and bad reliability in the prior art.

A method for performing wear leveling in a memory according to an embodiment of the present invention, including:

dividing life cycle of the memory including more than one Physical Blocks into at least one sampling interval;

for each sampling interval, getting a first Physical Block by taking statistics of degree of wear of each Physical Block in the memory in the current sampling interval;

getting a second Physical Block by taking statistics of update times of each logical address in the current sampling interval; and exchanging the logical address and data of the first Physical Block and the second Physical Block.

An apparatus for performing wear leveling in a memory according to an embodiment of the present invention, including:

a first unit, for dividing life cycle of the memory into at least one sampling interval;

a second unit, for getting a first Physical Block by taking statistics of degree of wear of each Physical Block in the memory in the current sampling interval, and getting a second Physical Block by taking statistics of update times of each logical address in the current sampling interval, with respect to each sampling interval divided by the first unit;

a third unit, for exchanging the logical address and data of the first Physical Block and the second Physical Block gotten by the second unit.

According to the present invention, the life cycle is divided into multiple sampling intervals, the Physical Block worn severely in each sampling interval is found separately and mapped to the logical address that is updated infrequently, thus implementing the even erase/write operation of each Physical Block via decreasing the update times of the Physical Block. All of the sampling intervals are mutually independent, so the statistics of the degree of wear of Physical Blocks in the current sampling interval is independent of the other sampling intervals before or behind the current sampling interval. Therefore, even though abnormal situations such as power-off may happen, which makes the wear leveling unable to be processed during the current sampling interval, the wear leveling in the other sampling intervals in the life cycle of the memory will not be affected. The wear of Physical Blocks in the memory is even for the entire life cycle. However, because the information required for wear leveling is collected and accumulated from the beginning of the memory usage in the prior art, once the information is lost because of an abnormal situation, the new information accumulated later can not reflect the wear status of the Physical Blocks precisely, so that the reliability of the wear leveling decreases.

Furthermore, compared with the conventional wear leveling method for memory, the present invention has the following advantages:

1. It is not necessary to store the history data of the entire life cycle for each Physical Block in the memory and occupy large amount of memory resource of the memory.

2. It has good power-off protecting function and can not be affected by abnormal power-off of the system.

3. It will not be limited by new properties of the memory and is suitable to be used on all memories that is easy to be worn.

4. The implementing mechanism is reliable and simple.

DETAILED DESCRIPTION

The inventors of the present invention finds that the conventional method can meet the basic requirement of wear leveling, but has following disadvantages and shortages:

1. The information such as the number of erase/write operations during the entire life cycle of the memory unit is stored in a special space of the memory unit, which causes the waste of memory resource.

2. In the case where the system is abnormally turned off, the information such as the number of erase/write operations is easily lost, which causes insufficient wear leveling.

3. The storage of the information such as the number of erase operations in the memory unit is limited by properties of new memory types (e.g. multi-level cell flash memory), which causes inconvenience to memory space management by the software/hardware of memory device.

Accordingly, a method and an apparatus for performing wear leveling effectively in a memory system are required. That is, an automatic wear leveling process is required, so that evenness of the wear of corresponding memory units in the memory system is increased without affecting the general performance of the memory system.

In order to further understand the above purpose, features and advantages of the present invention, the present invention is further described in detail through drawings and embodiments below.

The technical solution provided by the embodiments of the present invention aims at the erase/write wear phenomenon of various memory devices. The phenomenon is independent of the special factors such as the data space distribution method in the memory, so the method and apparatus provided by the embodiments of the present invention can be applied to various types of memory. For the convenience of description, the Flash memory will be used uniformly to describe the embodiments of the present invention. The core conception of the present invention is as follows: a life cycle model of the Flash memory is built according to the specific usage rule of the Flash memory. In the life cycle model, partial sampling points are set, so that the entire life cycle is divided into multiple partial sampling phases (also called sampling intervals). From the starting point of a partial sampling phase, history data corresponding to the wear of the memory units start to be collected, and at the ending point of the partial sampling phase, the history data collected in the partial sampling phase are analyzed. Based on the analysis on the history data, how to perform the wear leveling is further determined. The memory includes multiple Physical Blocks. In a partial sampling phase, the degree of wear of each Physical Block in the memory in the partial sampling phase is taken statistics to get a first Physical Block, and the number of update times of each logical address in the partial sampling phase is taken statistics to get a second Physical Block, then the logical address and data of the first Physical Block and the second Physical Block are exchanged, so that the wear leveling between the first Physical Block and the second Physical Block can be implemented. The first Physical Block may be the Physical Block with the highest degree of wear, and the second Physical Block may be the Physical Block corresponding to the logical address with the least update times, and the wear leveling is implemented by exchanging the logical address and data of the first Physical Block and the second Physical Block. Furthermore, the first Physical Block may include several Physical Blocks with higher degree of wear, and compared with the first Physical Block, the second Physical Block may include the same amount of Physical Blocks corresponding to the logical addresses with less update times; when the wear leveling is performed, the Physical Blocks included in the first Physical Block and the Physical Blocks included in the second Physical Block are required to form pairs, each pair consists of a first Physical Block and a second Physical Block, then logical address and data are exchanged between the first Physical Block and the second Physical Block in the pair. Except for the above two methods, there are many other methods for selecting the first Physical Block and the second Physical Block, all the selecting methods based on the partial sampling phase provided by the present invention fall into the scope of the present invention. For example, the first Physical Block may be one of the Physical Blocks, the degree of wear of which has reached a certain degree, and the second Physical Block may be one of the Physical Blocks corresponding to the logical addresses, the number of update times of which is lower than a certain amount; or the first Physical Block may be the Physical Block with the lowest degree of wear, and the second Physical Block may be the Physical Block corresponding to the logical address with the most update times.

Figure 1:
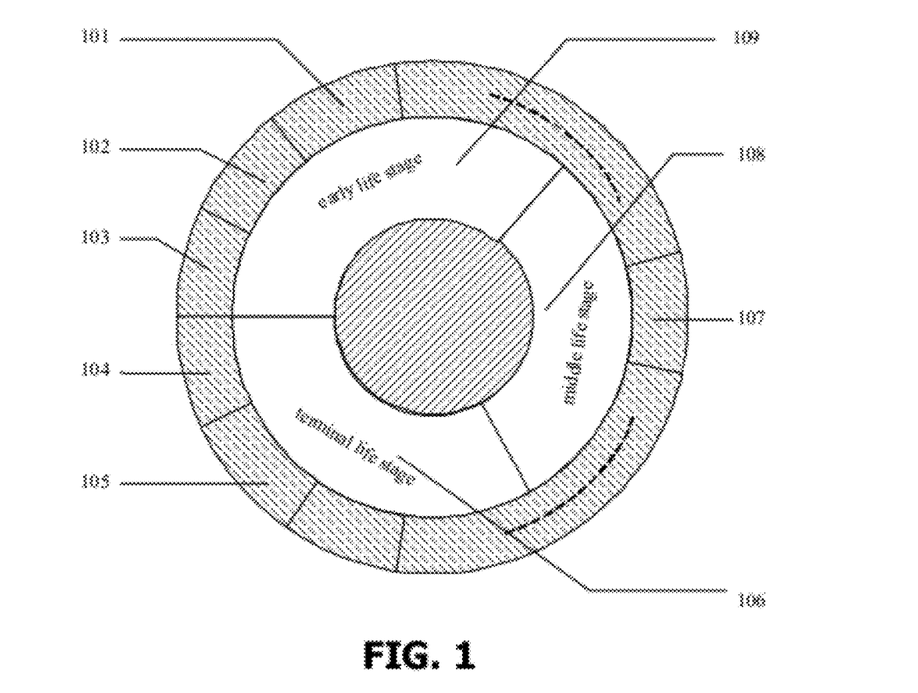
FIG. 1 is a schematic illustration of a life cycle model of a Flash memory system built according to an embodiment of the present invention.

FIG. 1 shows a life cycle model of the Flash memory built according to an embodiment of the present invention. As shown in FIG. 1, the entire life cycle is divided into an early life stage 106, a middle life stage 108 and a terminal life stage 109. The Flash memory enters the early life stage after it is manufactured, the degree of wear of most memory Blocks are relatively low during the early life stage, and the general performance of the Flash memory system is relatively good. After the frequent wear during the middle life stage, the Flash memory enters the terminal life stage, during which the degree of wear of most memory Blocks are high. It is particularly important to perform the wear leveling to prolong the life span of the Flash memory. In an embodiment of the present invention, the life cycle is divided into n partial sampling phases, such as the partial sampling phase 1 (101), the partial sampling phase 2 (102) and the partial sampling phase 3 (103) included in the early life stage 106, and the partial sampling phase n−1 (104) and the partial sampling phase n (105) included in the terminal life stage 109. The specific value of n is determined by the memory manufacturer depending on the life span of the specific memory. Take some partial sampling phase included in the middle life stage for example, such as the partial sampling phase i (107), after the partial sampling phase begins, the history data will be collected each certain amount of cycles, and at the ending point of the partial sampling phase, the collected history data will be analyzed to further determine if the wear leveling should be performed. Because the process of wear leveling has been completed in the partial sampling phase i, the Flash memory system will work in the status of even wear when it enters the partial sampling phase i+1. That is, the action of wear leveling within a particular partial sampling phase is carried out at the ending point of the last partial sampling phase.

Figure 2:
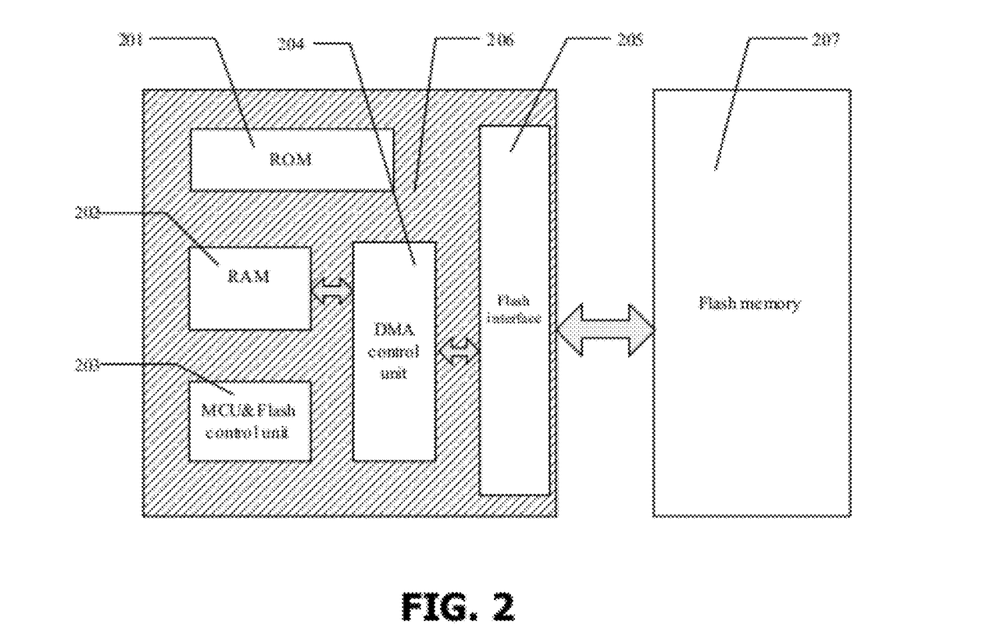
FIG. 2 is a structural illustration of a Flash memory embedded system according to an embodiment of the present invention.

FIG. 2 shows a structural illustration of a Flash memory embedded system according to an embodiment of the present invention. As shown in FIG. 2, the system mainly includes an application system 206 and a Flash memory 207. The main functional components in the Flash memory embedded system and their cooperation are shown in FIG. 2. The application system 206 may be integrated into the IC chip. Alternatively, it may be separated from the IC chip. The double arrowhead shows the direction of Flash data flow, which includes command word and specific data content in the Flash.

The application system 206 includes a Read-Only Memory (ROM) 201, a Random Access Memory (RAM) 202, a Micro Control Unit (MCU) 203, a Flash hardware interface 205. The ROM 201 is adapted to store startup code which can be read and executed by the MCU 203 directly and used for hardware initialization and reading subsequent code from the Flash memory 207. The RAM 202 is adapted to store temporary data and dynamic system code, and the dynamic system code can be read and executed by the MCU 203 directly. The MCU 203 is adapted to read code directly from the ROM 201 or the RAM 202, and it also has the functions of computation and control. The application system 206 may further include a Flash control unit, which is adapted to accelerate the Flash signal transmission. Of course, the Flash control unit may be integrated into the MCU 203. Alternatively, it may be configured to be connected with the MCU 203 via an interface. Furthermore, the application system 206 may include a Direct Memory Access (DMA) control unit 204, which is adapted to control the access of data or system code between the Flash memory 207 and the RAM 202. Of course, this function may be implemented via other feasible access control methods known to a person skilled in the art. The DMA is a mechanism of high speed data transmission. Through the DMA method, the data can be transmitted from a device to a memory, from a memory to a device, or from a section of a memory to another section of the memory. The Flash interface 205 is the hardware interface between the Flash memory 207 and the application system 206, interface signals of which are all standard signals of hardware interface of the Flash memory. The information of the Flash memory, such as command word, address sequence and data, can be transmitted over an I/O data line.

Figure 3:
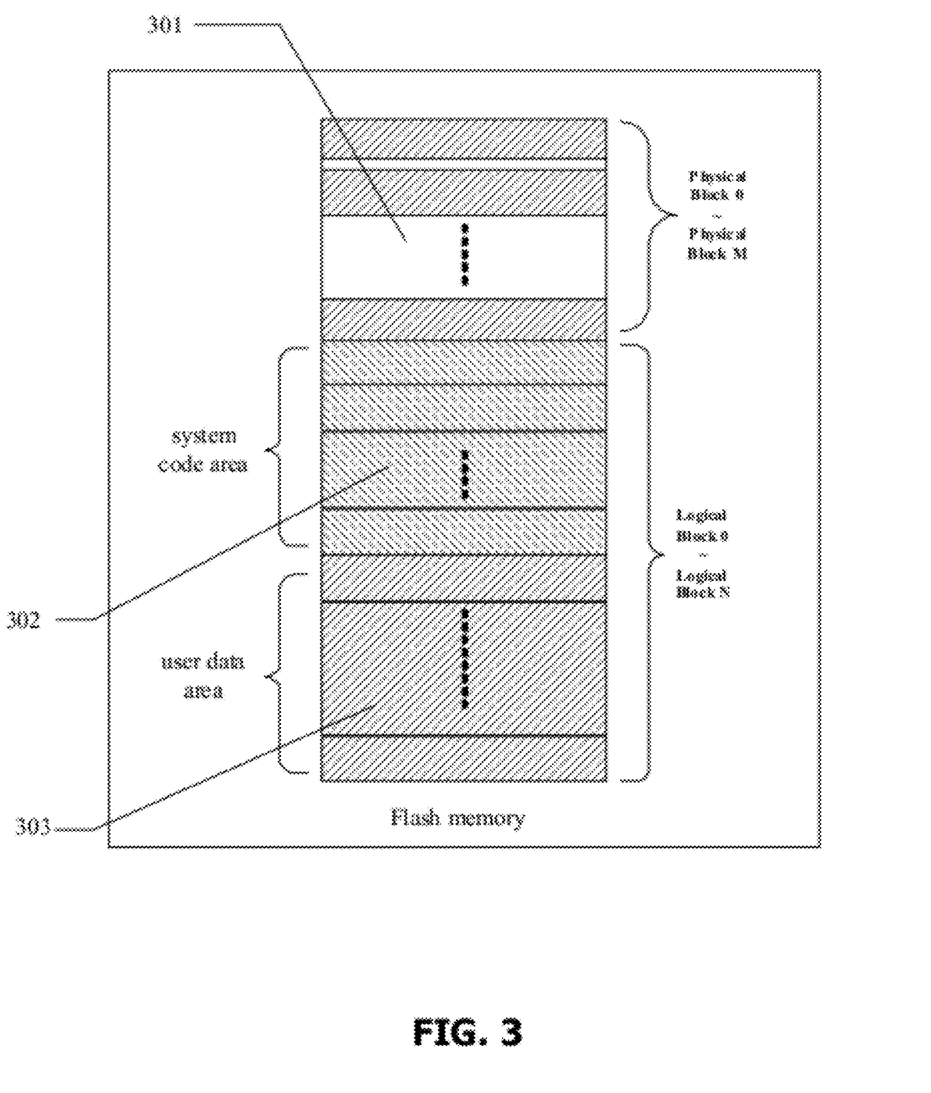
FIG. 3 is an illustration of space distribution for storing data via a Flash memory according to an embodiment of the present invention.

FIG. 3 shows an illustration of space distribution of the data in the Flash memory 207 according to an embodiment of the present invention. As shown in FIG. 3, in the embedded system, the Flash memory is the program memory, as well as the data memory, and it is composed of physical space and logical space. As shown in FIG. 3, the physical space 301 includes some reserved Physical Blocks starting from the initial address of the Flash memory, and it is mainly used for the startup of the system and the initialization of the operating system. The logical space is composed of a system code area 302 and a user data area 303. The system code area 302 which can not be seen by the user is adapted to store the code and data corresponding to the operating system and application program. The user data area 303 is adapted to store the data that the user can access. In the present invention, the operation of wear leveling in the Flash memory mainly aims at the Physical Blocks in the logical space.

Figure 4:
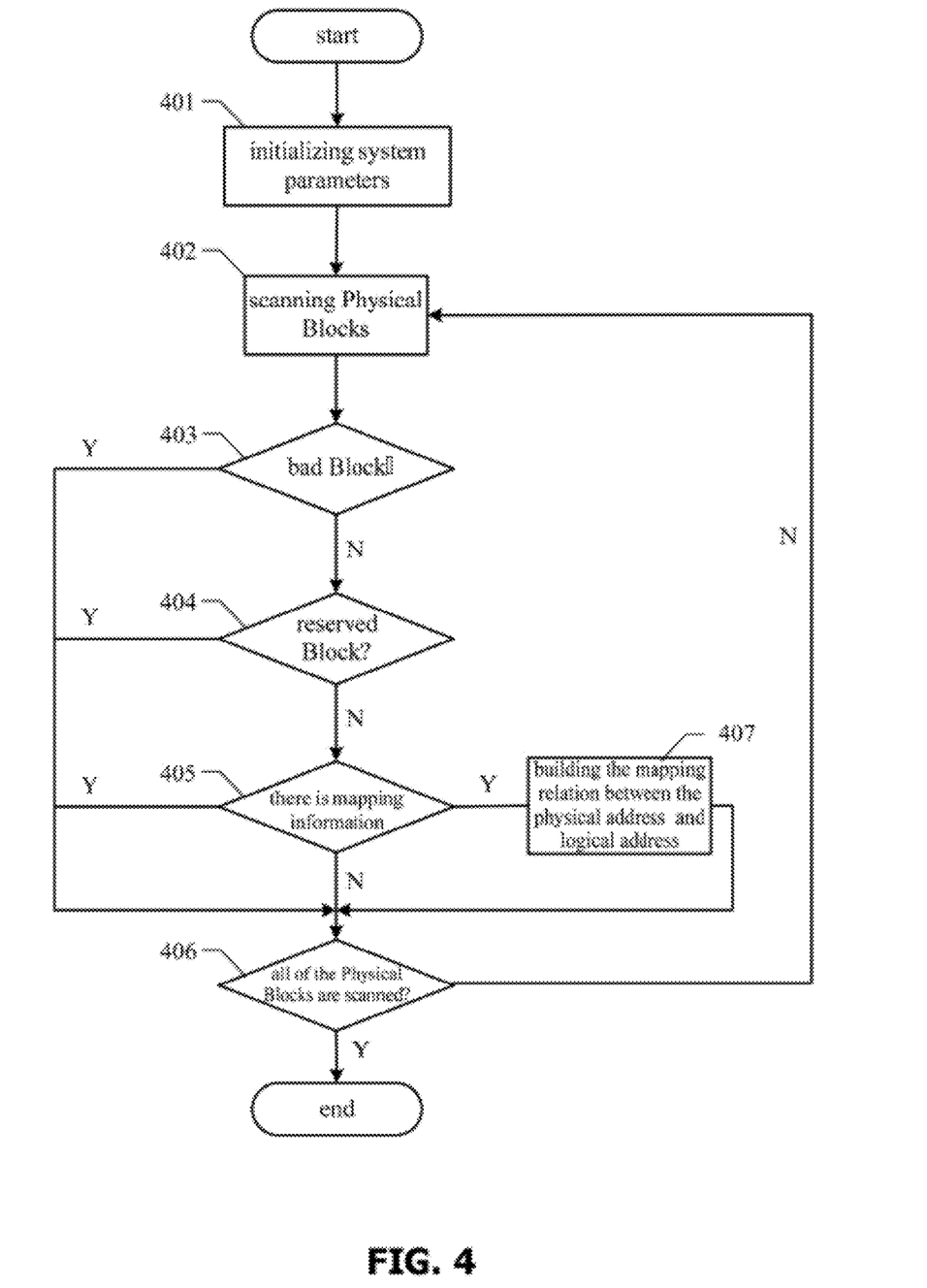
FIG. 4 is a flowchart of building a logic mapping table of a Flash memory according to an embodiment of the present invention.

Because of the instability of the Flash memory and the need of wear leveling, in the practical flash memory embedded system, the correspondence relationship of the logical address transmitted when the host accesses the Flash memory and the practical physical address of the physical unit in the Flash memory is not fixed. A random mapping table between the logical address and the physical address, or between the Logical Block and the Physical Block, is built to record the mapping relation between the Logical Block and the Physical Block. Take a table item representing a Physical Block for example, when the host needs to access the data of Logical Block 0, the physical address mapped to the Logical Block 0 should be found according to the logical mapping table, then the host operates the Physical Block corresponding to the physical address. In the illustration of space distribution shown in FIG. 3, all accesses to the logical spaces 302, 303 need to be done through the mapping table. FIG. 4 shows a flowchart of building the mapping table in which a Physical Block corresponds to a table item. As shown in FIG. 4, at Step 401, executing the operation of system initialization and setting the system parameters; at Step 402, scanning all of the Physical Blocks one by one; at Step 403 and 404, deciding the usage status of the current Physical Block including whether the current Physical Block is a usable Block and whether the current Physical Block is a reserved Block of the system according to the scan result of Step 402, and if the current Physical Block is a bad Block, eliminating the bad Block, if the current Physical Block is a reserved Block, skipping the reserved Block and scanning the remaining Physical Blocks one by one; at Step 405, deciding whether mapping information of corresponding logical mapping table is included in the current Physical Block, if yes, executing Step 407, building the mapping relation between the physical address of the Physical block and corresponding logical address; when all of the Physical Blocks are scanned and decided at Step 406, the logical mapping table is built.

Figure 5:
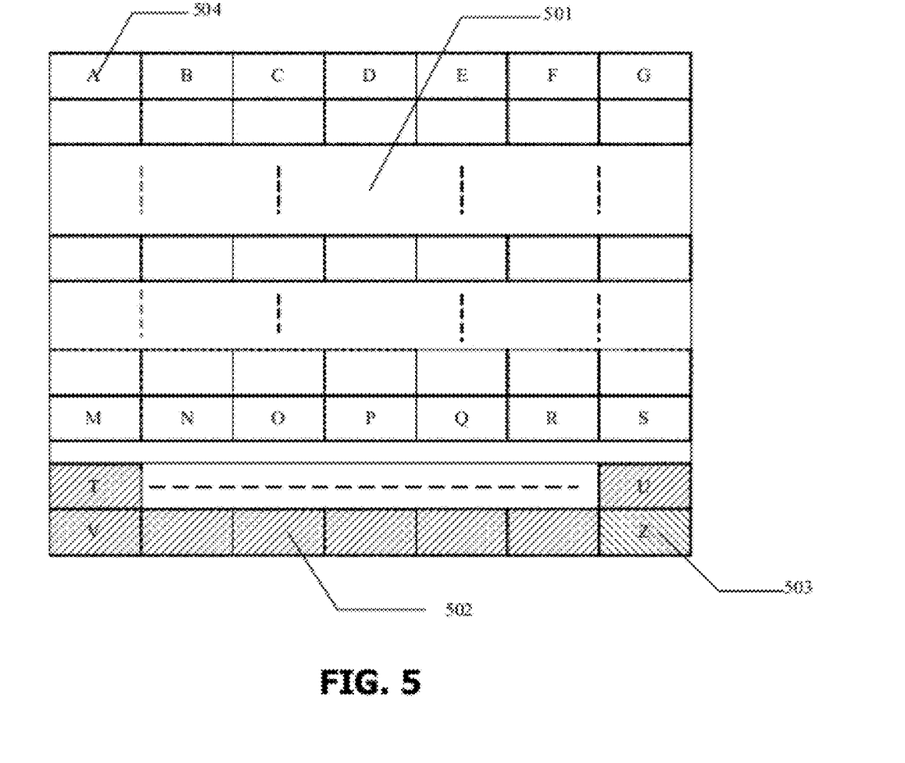
FIG. 5 is a structural schematic illustration of a logical mapping table of a Flash memory according to an embodiment of the present invention.

FIG. 5 shows a logical mapping table between the Logical Blocks and the Physical Blocks according to an embodiment of the present invention. As shown in FIG. 5, if the Flash memory has 1024 Physical Blocks, the mapping table has 1024 table items. Suppose there are 1000 Physical Blocks mapped with Logical Blocks, that is, the physical addresses of the 1000 Physical Blocks are set as the first 1000 table items of the table shown by 501. If the logical address that the host accesses the Flash memory points to the Logical Block 0, the corresponding Physical Block of the Logical Block 0, that is the Physical Block A 504, can be found in 501 according to the logical mapping table. 502 represents the reserve Blocks, which may be used for replacing the bad Blocks in the first 1000 table items. Further, there is a temporary backup Block 503, when the write operation is executed, the data to be written and the content of corresponding target Block in the logical mapping table should be written in the temporary backup Block first, then the temporary backup Block and the target Block are exchanged.

Figure 6:
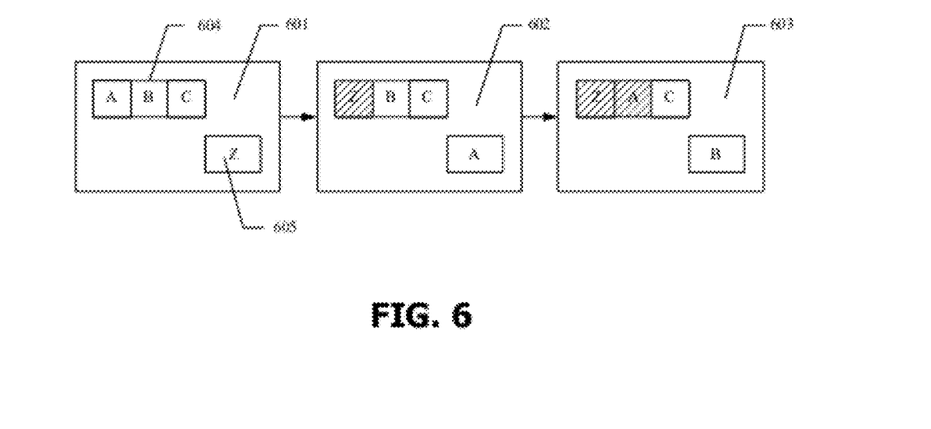
FIG. 6 is a schematic illustration of the change of the logic mapping table when the write operation is executed in the Flash memory according to an embodiment of the present invention.

Accordingly, when the write operation is executed, the content of the logical mapping table may be changed. With respect to the related Physical Block, the logical address of which is updated. FIG. 6 shows the specific change of the logic mapping table when the write operation to the Logical Block 0 and the Logical Block 1 is continuously executed according to an embodiment of the present invention. As shown in FIG. 6, 601 represents the content of the logical mapping table before the write operation to the Logical Block 0 is executed. It can be seen from 604 that the Logical Block 0 and the Logical Block 1 correspond to the table items of Physical Block A and Physical Block B respectively. And 605 shows the current temporary backup Block is Physical Block Z. After the write operation to the Logical Block 0 is completed, the temporary backup Block and the corresponding target Block in the logical mapping table need to be exchanged. 602 represents the content of the logical mapping table after the write operation to the Logical Block 0 is completed and before the write operation to the Logical Block 1 is executed. Currently, the Logical Block 0 corresponds to the table item of the Physical Block Z in the logical mapping table, and the temporary backup Block is the Physical Block A. After the write operation to the Logical Block 1 is completed, the temporary backup Block and the corresponding target Block in the logical mapping table also need to be exchanged. 603 represents the content of the logical mapping table after the write operation to the Logical Block 1 is completed. Currently, the Logical Block 1 corresponds to the table item of the Physical Block A in the logical mapping table, and the temporary backup Block is the Physical Block B. It can be seen from FIG. 6 that the table item corresponding to Logical Block 2 is always the Physical Block C, no change has happened. Therefore, in a certain sampling phase, if the erase/write operation is not executed in one area, the content of logical mapping table corresponding to the area will not change.

Figure 7:
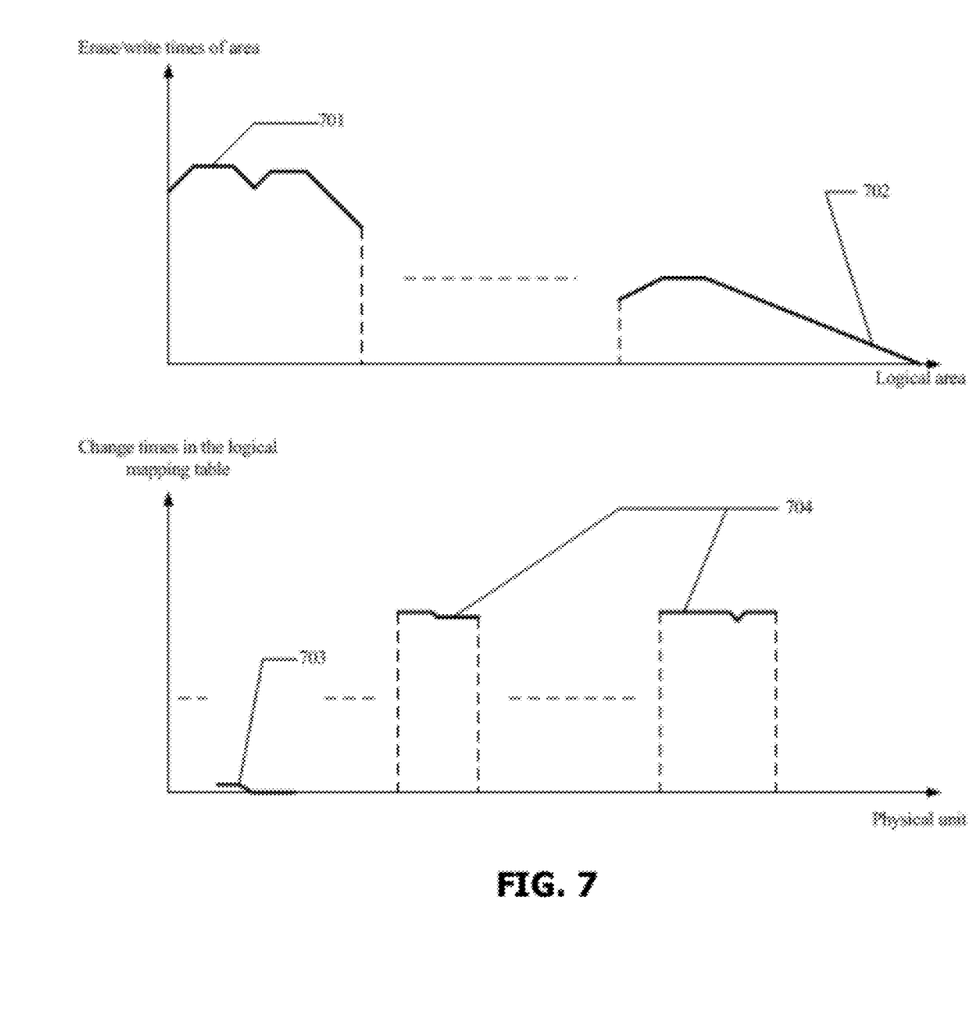
FIG. 7 is a schematic illustration of degree of wear in area of the Flash memory according to an embodiment of the present invention.

At the same time, it can be seen that the more drastically the content of logical mapping table is changed in a certain partial sampling phase, the more frequently the operation to the Flash memory in the partial sampling phase is executed. Therefore, the logical mapping table may be the data required to be collected during each partial sampling phase according to the present invention. At the ending point of each sampling phase, all of the history data collected during the phase, which is the logical mapping table of each sampling point, is analyzed, and the policy is further made. When the data is analyzed, according to the dynamic activity attribute of the logical mapping table, the logical addresses of the inactive area, which is the easy task area in the logical mapping table, are found, and then the Physical Blocks operated frequently are found. These Physical Blocks and the Physical Blocks in the easy task area are exchanged by exchanging the logical addresses and data mutually. FIG. 7 is a schematic illustration of degree of wear in area of the Flash memory achieved by analyzing the history data collected according to an embodiment of the present invention. As shown in FIG. 7, 701 represents the hard task area, which is the active area in the logical mapping table. 702 represents the easy task area, which is the inactive area in the logical mapping table. 703 represents the easy task Physical units. 704 represents the hard task Physical units. If the wear operation is not executed to the memory or is distributed evenly and the active area thereby is not found when the history data is analyzed and all the areas are easy task areas, it is unnecessary to take further measure to perform wear leveling, but rather to go to the next sampling phase directly to make the analysis and decision at the ending point of the next sampling phase. Therefore, at the starting point of each sampling phase, the memory system is in better even wear status, which appeared at the ending point of the last sampling phase, so the wear leveling of the next partial sampling phase is carried out in the case of even wear status. As a whole, the total wear leveling of the memory during the entire life cycle is ensured by the wear leveling of each sampling phase.

The objective basis of the present invention is as follows: with respect to the entire life cycle model of an object, the characteristic and rule of the object represented by the data collected during a partial sampling phase is similar to those represented by the data collected during the adjacent partial sampling phase. Accordingly, the characteristic and rule of the object embodied in a partial sampling phase can basically reflect the characteristic and rule of the object embodied in the entire life cycle. If the characteristics of wear degrees in the areas found in two adjacent partial sampling phases are similar, the change of the characteristics is continuous during the entire life cycle. Therefore, the wear leveling algorithm carried out in continuous partial sampling phases can ensure that the memory is in wear leveling status during the entire life cycle.

In order to describe the conception and implementing process of the present invention, the implementing method of the wear leveling algorithm will be illustrated using examples. Assume the Flash memory is currently located at the starting point of partial sampling phase i of the life cycle and is in the even wear status of each physical unit which is implemented at the ending point of partial sampling phase i−1. From the starting point to the ending point of the sampling phase i, the data corresponding to each sampling time, which is the logical mapping table of the Flash memory, are collected depending on certain sampling rate. For easy description, 5 sampling points are configured in the sampling phase i. Table 1 shows the history data collected at the starting point of the sampling phase i, the Flash memory is in better wear leveling status at this time.

TABLE 1

| 0x3ff | 0x3fe | 0x3fd | 0x3fc | 0x3fb | 0x3fa | 0x3f9 |
|-------|-------|-------|-------|-------|-------|-------|
| 0x3f8 | 0x3f7 | 0x3f6 | 0x3f5 | 0x3f4 | 0x3f3 | 0x3f2 |
| 0x3f1 | 0x3f0 | 0x3ef | 0x3ee | 0x3ed | 0x3ec | 0x3eb |
| ... | ... | ... | ... | ... | ... | ... |
| 0x2fc | 0x2f9 | 0x2f0 | 0x278 | 0x25c | 0x222 | 0x30c |
| 0x21c | 0x1fc | 0x18c | 0x17f | 0x187 | 0x156 | 0x16d |
| ... | ... | ... | ... | ... | ... | ... |
| 0x100 | 0x120 | 0xfc | 0xf6 | 0xf0 | 0xee | 0xe4 |
| 0xdc | 0xcc | 0xa0 | 0x89 | 0x88 | 0x85 | 0x66 |
| 0x64 | 0x50 | 0x44 | 0x45 | 0x43 | 0x40 | 0x33 |

Table 2 shows the history data collected at the second sampling point of the sampling phase i. Comparing with Table 1, the erase/write operation is executed in some areas of the Flash memory.

TABLE 2

| 0x16  | 0x3ff | 0x3fe | 0x3fd | 0x3fc | 0x3fb | 0x3fa |
|-------|-------|-------|-------|-------|-------|-------|
| 0x3f9 | 0x3f8 | 0x3f7 | 0x3f6 | 0x3f5 | 0x3f4 | 0x3f3 |
| 0x3f1 | 0x3f0 | 0x3f2 | 0x3ee | 0x3ef | 0x3ec | 0x3eb |
| ...   | ...   | ...   | ...   | ...   | ...   | ...   |
| 0x3ed | 0x2fc | 0x2f9 | 0x278 | 0x25c | 0x222 | 0x30c |
| 0x21c | 0x1fc | 0x18c | 0x17f | 0x187 | 0x156 | 0x16d |
| ...   | ...   | ...   | ...   | ...   | ...   | ...   |
| 0x100 | 0x120 | 0xfc  | 0xf6  | 0xf0  | 0xee  | 0xe4  |
| 0xdc  | 0xcc  | 0xa0  | 0x89  | 0x88  | 0x85  | 0x66  |
| 0x64  | 0x50  | 0x44  | 0x45  | 0x43  | 0x40  | 0x33  |

Table 3 shows the history data collected at the third sampling point of the sampling phase i. Comparing with Table 2, the erase/write operation is executed in some areas of the Flash memory.

TABLE 3

| 0x2f0 | 0x16  | 0x3ff | 0x3fe | 0x3fd | 0x3fc | 0x3fb |
|-------|-------|-------|-------|-------|-------|-------|
| 0x3fa | 0x3f9 | 0x3f8 | 0x3f7 | 0x3f6 | 0x3f5 | 0x3f4 |
| 0x3f1 | 0x3f0 | 0x3f3 | 0x3ee | 0x3f2 | 0x3ec | 0x3eb |
| ...   | ...   | ...   | ...   | ...   | ...   | ...   |
| 0x3ed | 0x2fc | 0x2f9 | 0x3ef | 0x278 | 0x25c | 0x30c |
| 0x21c | 0x1fc | 0x18c | 0x17f | 0x187 | 0x156 | 0x16d |
| ...   | ...   | ...   | ...   | ...   | ...   | ...   |
| 0x100 | 0x120 | 0xfc  | 0xf6  | 0xf0  | 0xee  | 0xe4  |
| 0xdc  | 0xcc  | 0xa0  | 0x89  | 0x88  | 0x85  | 0x66  |
| 0x64  | 0x50  | 0x44  | 0x45  | 0x43  | 0x40  | 0x33  |

Table 4 shows the history data collected at the fourth sampling point of the sampling phase i. Comparing with Table 3, the erase/write operation is executed in some areas of the Flash memory.

TABLE 4

| 0x222 | 0x2f0 | 0x16  | 0x3ff | 0x3fe | 0x3fd | 0x3fc |
|-------|-------|-------|-------|-------|-------|-------|
| 0x3fb | 0x3fa | 0x3f9 | 0x3f8 | 0x3f7 | 0x3f6 | 0x3f5 |
| 0x3f1 | 0x3f0 | 0x3f4 | 0x3ee | 0x3f3 | 0x3ec | 0x3eb |
| ...   | ...   | ...   | ...   | ...   | ...   | ...   |
| 0x3ed | 0x2fc | 0x2f9 | 0x3ef | 0x278 | 0x25c | 0x30c |
| 0x3f2 | 0x21c | 0x1fc | 0x17f | 0x187 | 0x156 | 0x16d |
| ...   | ...   | ...   | ...   | ...   | ...   | ...   |
| 0x100 | 0x120 | 0xfc  | 0xf6  | 0xf0  | 0xee  | 0xe4  |
| 0xdc  | 0xcc  | 0xa0  | 0x89  | 0x88  | 0x85  | 0x66  |
| 0x64  | 0x50  | 0x44  | 0x45  | 0x43  | 0x40  | 0x33  |

Table 5 shows the history data collected at the fifth sampling point of the sampling phase i. Comparing with Table 4, the erase/write operation is executed in some areas of the Flash memory.

TABLE 5

| 0x18c | 0x222 | 0x2f0 | 0x16  | 0x3ff | 0x3fe | 0x3fd |
|-------|-------|-------|-------|-------|-------|-------|
| 0x3fc | 0x3fb | 0x3fa | 0x3f9 | 0x3f8 | 0x3f7 | 0x3f6 |
| 0x3f1 | 0x3f0 | 0x3f5 | 0x3ee | 0x3f4 | 0x3ec | 0x3eb |
| ...   | ...   | ...   | ...   | ...   | ...   | ...   |
| 0x3ed | 0x2fc | 0x2f9 | 0x3ef | 0x278 | 0x25c | 0x30c |
| 0x3f2 | 0x21c | 0x1fc | 0x3f3 | 0x17f | 0x187 | 0x16d |
| ...   | ...   | ...   | ...   | ...   | ...   | ...   |
| 0x100 | 0x120 | 0xfc  | 0xf6  | 0xf0  | 0xee  | 0xe4  |
| 0xdc  | 0xcc  | 0xa0  | 0x89  | 0x88  | 0x85  | 0x66  |
| 0x64  | 0x50  | 0x44  | 0x45  | 0x43  | 0x40  | 0x33  |

According to the data shown in Tables 1-5, the history data are analyzed to find out the wear situation of each area of the Flash memory in the sampling phase i and to determine further wear leveling measure.

With respect to the history data shown in Tables 1-5, in order to find out the degree of wear of each area of the Flash memory in the sampling phase, two kinds of data statistics should be processed respectively. On the one hand, the change of table item content on each position of the logical mapping table is taken statistics, so that the easy task area of the logical mapping table in the partial sampling phase can be found; on the other hand, the position change of each specific table item is taken statistics, so that the hard task physical unit in the Flash memory during the partial sampling phase can be found.

Firstly, the change of table item content on each position is taken statistics. By traversing each position of the whole logical mapping table, the table item contents collected at each history data sampling point are compared, so that the change times of table item corresponding to the position during the last partial sampling phase can be counted, that is with respect to each logical address of the logical mapping table, the number of change times of physical address mapped to the logical address is counted. The less frequently the change happens, the easier the task of the area is; the more frequently the change happens, the harder the task of the area is. A threshold may be set. If the number of change times is equal to or exceeds the threshold, the task of the area is hard; if the number of change times is less than the threshold, the task of the area is easy. In an embodiment of the present invention, the threshold may be set as 3 times. It can be known from the Tables 1-5 that the number of change times of the first 14 Logical Blocks and the Logical Block 16 is 4, the task of these areas is relatively hard, and the number of change times of the other Logical Blocks, especially the last several tens of Logical Blocks, is less than 2, hence the task of these areas is relatively easy.

Secondly, the position change of each specific table item is taken statistics. According to the increasing order of physical addresses, the Physical Blocks of the whole Flash memory are traversed. The area position corresponding to the Physical Blocks can be found by searching the logical mapping table. The mapping positions of the Physical Block collected at each history data sampling point are compared in order to count the position change times of the Physical Block in the logical mapping table during the partial sampling phase. That is, with respect to a Physical Block, the change times of the logical address mapped to its physical address is counted. The more frequently the position changes, the harder the task of the physical unit is; the less frequently the position changes, the easier the task of the physical unit is.

According to another embodiment of the present invention, a section of memory space in the memory, such as a page, is used for storing the position change times of the logical address mapped to the physical address of the Physical Block during the partial sampling phase, that is the erase/write times of the Physical Block, and the number of position change times does not need to be counted at the ending point of sampling interval according the sample of the logical mapping table. This method has the advantage of easy implementation, and is more convenient and faster for obtaining the erase/write times of each Physical Block during the sampling interval. Furthermore, only the number of erase/write times during the current partial sampling phase is stored according to the embodiment of the present invention, comparing with the prior art which stores the erase/write times of each Physical Block during the entire life cycle, the data amount required to be stored is much less.

Likewise, a threshold may be set. If the number of position change times exceeds the threshold, the task of the physical unit is hard; if the number of position change times is less than the threshold, the task of the physical unit is easy. In an embodiment of the present invention, the threshold may be set as 3 times. For example, it can be known from Tables 1-5 that the number of position change times of Physical Blocks, physical addresses of which are 0x3fa and 0x3fb, is 4, the task of these Physical Blocks are hard, and the number of position change times of Physical Block, physical address of which is 0x40, is 0, the task of the Physical Block is easy.

Based on the statistic results of above two aspects, the set of the easy task area and the hard task Physical Blocks during the last partial sampling phase can be found. Then, the specific measure of wear leveling is carried out. Firstly, the logical mapping table is modified to map the hard task Physical Blocks from the current area to the easy task area, and then map the original table items corresponding to the easy task area to the area of the original hard task Physical Blocks. According to the modified logical mapping table, the practical data are exchanged between the two areas. After the above wear leveling measure is carried out, the current logical mapping table is shown in Table 6.

TABLE 6

| 0x18c | 0x120 | 0xfc | 0xf6 | 0xf0 | 0xee | 0xe4 |
| 0xdc | 0xcc | 0xa0 | 0x89 | 0x88 | 0x85 | 0x66 |
| 0x3f1 | 0x3f0 | 0x44 | 0x3ee | 0x43 | 0x3ec | 0x3eb |
| ... | ... | ... | ... | ... | ... | ... |
| 0x3ed | 0x2fc | 0x2f9 | 0x3ef | 0x278 | 0x25c | 0x30c |
| 0x3f2 | 0x21c | 0x1fc | 0x3f3 | 0x17f | 0x187 | 0x16d |
| ... | ... | ... | ... | ... | ... | ... |
| 0x100 | 0x222 | 0x2f0 | 0x16 | 0x3ff | 0x3fe | 0x3fd |
| 0x3fc | 0x3fb | 0x3fa | 0x3f9 | 0x3f8 | 0x3f7 | 0x3f6 |
| 0x64 | 0x50 | 0x3f5 | 0x45 | 0x3f4 | 0x40 | 0x33 |

Compared with Table 6, in Tables 1-5, the hard task area is in the first half of the logical mapping table, that is, the first half of the logical mapping table is the area updated frequently, so the Physical Blocks mapped to the area, such as the Physical Block corresponding to the physical address 0x3fa, are erased/written frequently. However, in Table 6, the hard task Physical Blocks, such as the Physical Block corresponding to the physical address 0x3fa, are mapped to the easy task area of the logical mapping table, which is the area updated infrequently. Simultaneously, in Table 6, the area with lower update times corresponding to the table items for the last sampling point shown in Table 5, such as the Physical Block corresponding to the physical address 0xa0, is mapped to the area of the last sampling point, in which the Physical Block corresponding to the physical address 0x3fa locates.

When there are multiple hard task Physical Blocks in the logical mapping table need to be re-mapped, these Physical Blocks are arranged according to the decreasing order of erase/write times during the current sampling interval, thus obtaining an arranged erase/write times table. And the logical addresses are arranged according to the increasing order of change times of mapping Physical Blocks, thus obtaining an arranged update times table. Then according to the order in both tables, the hard task Physical Block in the erase/write times table and the Physical Block corresponding to the logical address with the same order in the update times table are composed into a pair respectively, and the logical address and data of the pair of Physical Blocks are exchanged. Specifically, the first Physical Block in the erase/write times table and the Physical Block corresponding to the first logical address in the update times table are composed into a pair, and the logical addresses and data of these two Physical Blocks are exchanged. Then the second Physical Block in the erase/write times table and the second logical address in the update times table may be processed based on the same method, until all of the logical addresses and data of the hard task Physical Blocks are exchanged.

When the data are exchanged, it is possible that at the last sampling point, the physical address of the hard task Physical Block is mapped to the easy task logical address, even that the hardest task Physical Block is mapped to the easiest task logical address, in such a case, the logical address and data do not need to be exchanged. Accordingly, an embodiment of the present invention further provides the following solution.

Before exchanging the logical address and data, detecting whether the Physical Blocks composed into a pair are the same Physical Block, if yes, the hardest task Physical Block is mapped to the easiest task logical address, and the logical address and data do not need to be exchanged.

Further, before exchanging the logical address and data, detecting whether the logical address and data of one of the Physical Blocks composed into a pair have been exchanged during the current wear leveling process, if yes, the logical address and data of the Physical Block do not need to be exchanged.

After the above steps, when the next partial sampling phase accesses the Flash memory, the hard task area, that is the first half of the logical mapping table, still will be updated frequently, but the current Physical Blocks of the first half of the logical mapping table are the easy task Physical Blocks with low degree of wear in the last partial sampling phase. Therefore, after multiple partial sampling phase, the number of times of each Physical Block mapped to the hard task area or the easy task area of the logical mapping table is even, so that the degree of wear of each Physical Block is also even. Since the characteristics of the degree of wear of areas found in two adjacent partial sampling phases are similar, the wear leveling algorithm carried out at the ending point of the sampling phase i ensures that the even wear status of the memory can be remained after the wear during the sampling phase i+1 and the wear leveling measure carried out at the ending point of the sampling phase i+1, so that the wear leveling status can be remained during the entire life cycle of the memory.

Figure 8:
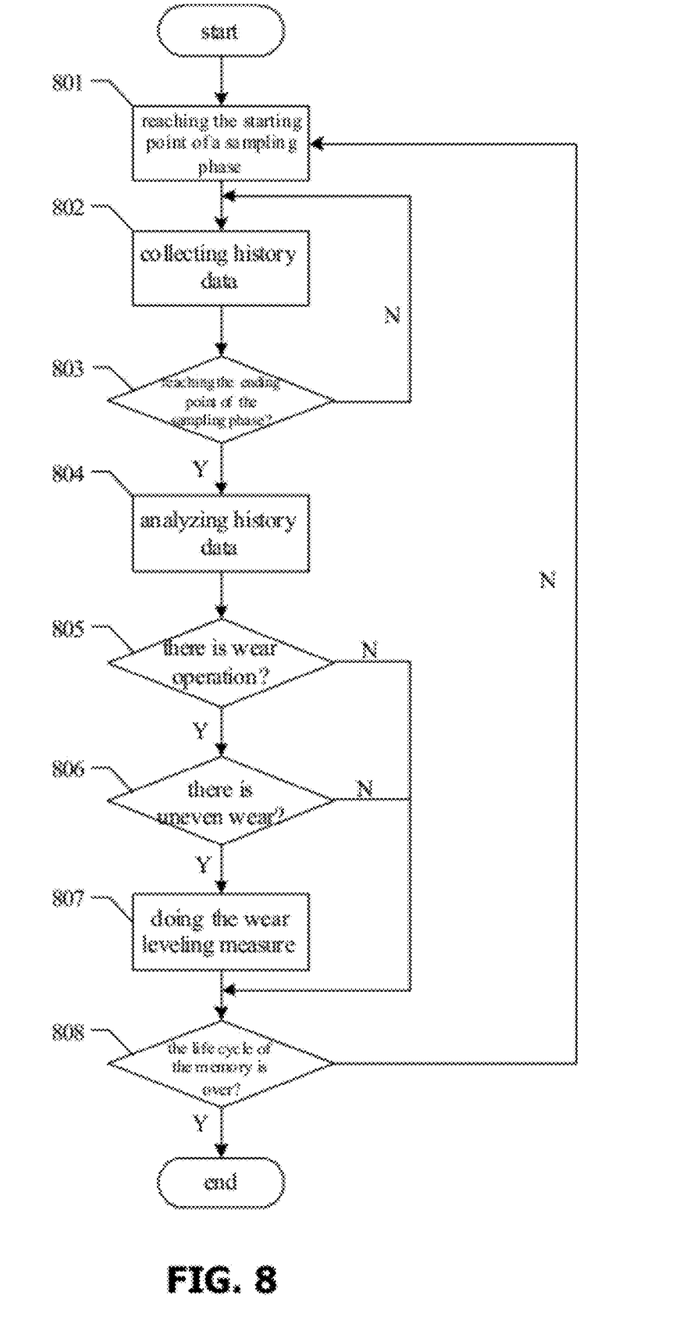
FIG. 8 is a flowchart of a method for performing wear leveling during entire life cycle according to an embodiment of the present invention.

FIG. 8 is a flowchart of a method for performing wear leveling during entire life cycle according to an embodiment of the present invention. As shown in FIG. 8, at Step 801, reaching the starting point of a sampling phase; at Step 802, according to a certain sampling frequency, collecting history data at each sampling point real-timely, until determining that the ending point of the sampling phase has reached at Step 803; at Step 804, the collected history data are analyzed, in order to make further decision and measure according to the analyzing result of Step 804; at Steps 805 and 806, determining whether there is the wear operation or uneven wear operation in the partial sampling phase, if no, the wear leveling measure does not need to be done and the process enters the next sampling phase; otherwise, at Step 807, the wear leveling measure will be done; the wear leveling process will be carried out cyclically, until determining the life cycle of the memory is over at Step 808.

Figure 9:
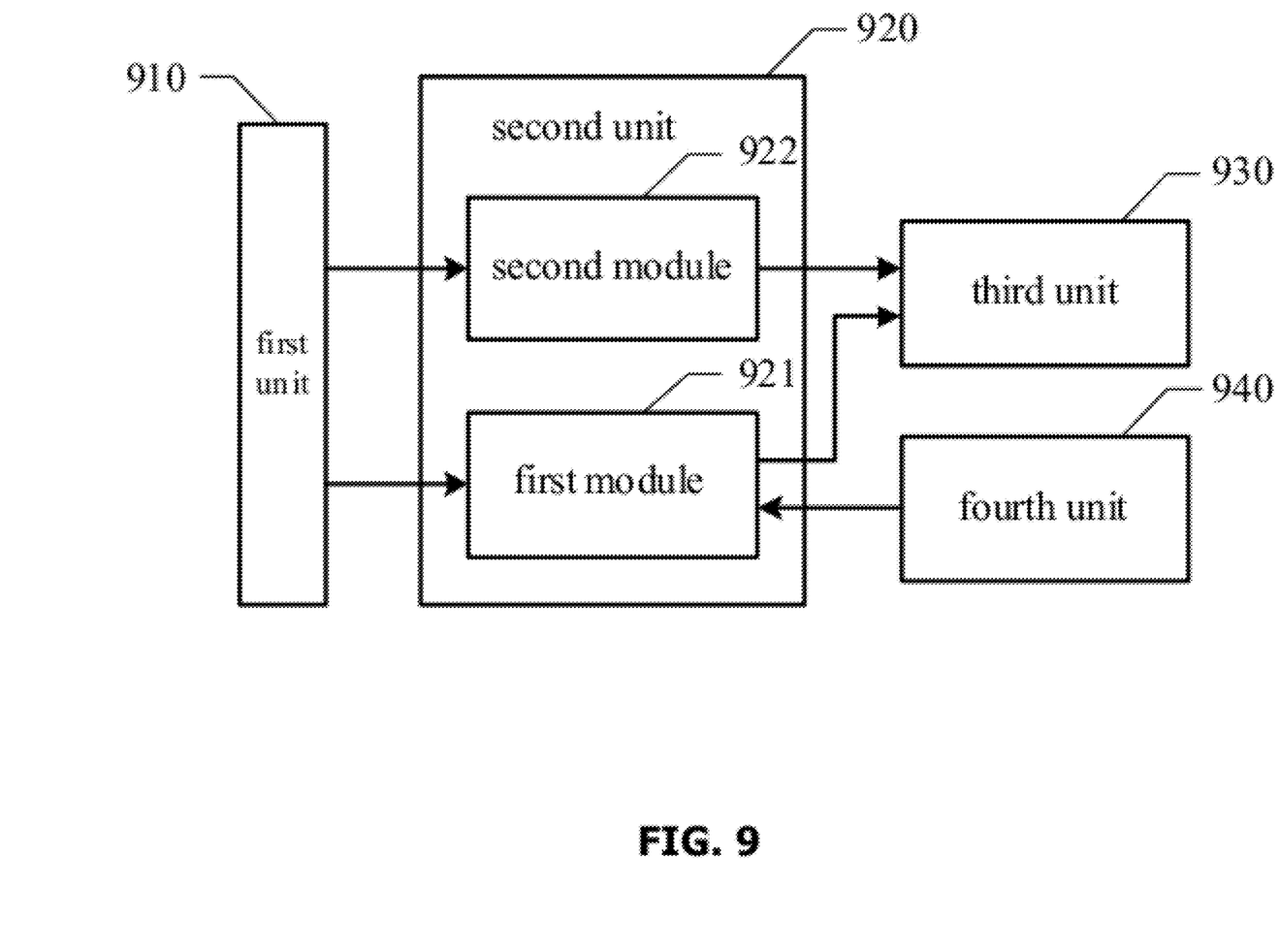
FIG. 9 is a structural schematic illustration of an apparatus for performing wear leveling according to an embodiment of the present invention.

FIG. 9 is a structural schematic illustration of an apparatus for performing wear leveling according to an embodiment of the present invention. As shown in FIG. 9, the apparatus includes:

a first unit 910, for dividing life cycle of the memory into at least one sampling interval;

a second unit 920, for getting a first Physical Block by taking statistics of degree of wear of each Physical Block in the memory in the current sampling interval, and getting a second Physical Block by taking statistics of update times of each logical address in the current sampling interval, with respect to each sampling interval divided by the first unit 910; and a third unit 930, for exchanging the logical address and data of the first Physical Block and the second Physical Block gotten by the second unit 920.

The second unit 920 includes a first module 921 and a second module 922. The first module 921 is used for getting the first Physical Block by taking statistics of the degree of wear of each Physical Block in the memory in the current sampling interval, with respect to each sampling interval divided by the first unit 910. The second module 922 is used for getting the second Physical Block by taking statistics of the update times of each logical address in the current sampling interval, with respect to each sampling interval divided by the first unit 910.

The apparatus further includes a fourth unit 940, which is used for recording the change times of the logical address mapped to the physical address of each Physical Block in the current sampling interval. The first module 921 of the second unit 920 is further used for taking statistics of the degree of wear based on the change times recorded by the fourth unit 940.

The first Physical Block may be the Physical Block with the highest degree of wear, and the second Physical Block may be the Physical block corresponding to the logical address with the least update times.

Furthermore, the first Physical Block may include at least one Physical Block, the degree of wear of which reaches a threshold, and the second Physical Block may include at least one Physical Block corresponding to at least one logical address with the least update times respectively, the number of Physical Blocks included in the second Physical Block and the number of Physical Blocks included in the first Physical Block are the same. The third unit 930 is further used for composing at least one pair of the first Physical Block and the second Physical Block from the at least one first Physical Block and the at least one second Physical Block, and exchanging the logical address and data of the first Physical Block and the second Physical Block of the same pair.

The memory is a Flash memory according to an embodiment of the present invention.

The embodiments of the present invention relate to a method for performing wear leveling in the memory based on the partial sampling mechanism, so as to avoid over erase/write operation on some memory units such as the Physical Blocks, and these memory units will not reach the maximum erasable programmable times earlier than the other memory units, thus implementing the purpose of wear leveling. The life span of the memory is increased through the method, the performance of the system is improved, and the implementing mechanism of the method is easy and reliable. Further, the shortcomings of the conventional method for performing wear leveling in the memory can be overcome by the present invention. The space resource of the memory need not to be occupied or may be occupied a bit. It has good power-off protecting function and can not be affected by abnormal power-off of the system. It can not be limited by new properties of the memory and may be suitable to all memories worn easily.

It should be noted that the above embodiments are only used to describe the technical solutions of the present invention, and they are not used to impose any restriction or limit to the present invention.

What is claimed is:

1. A method for performing wear leveling in a memory, comprising:
   dividing life cycle of the memory comprising more than one Physical Blocks into at least one sampling interval;
   for each sampling interval, getting a first Physical Block by taking statistics of degree of wear of each Physical Block in the memory in the current sampling interval;
   getting a second Physical Block by taking statistics of update times of each logical address in the current sampling interval; and
   exchanging the logical address and data of the first Physical Block and the second Physical Block,
   wherein getting the second Physical Block by taking statistics of update times of each logical address in the current sampling interval includes:
      sampling a logical mapping table of the memory in the current sampling interval, the logical mapping table recording a mapping relation between logical address and physical address of each Physical Block in the memory,
      taking statistics of the change times of the physical address mapped to each logical address from the sample obtained by the sampling, and
      selecting a Physical Block corresponding to a logical address with the least change times as the second Physical Block,
   wherein getting the first Physical Block by taking statistics of the degree of wear of each Physical Block in the memory in the current sampling interval includes:
      taking statistics of the change times of the logical address mapped to the physical address of each Physical Block from the sample obtained by the sampling, and
      selecting the Physical Block with the most change times of the logical address as the first Physical Block, and
   wherein taking statistics of the change times of the logical address mapped to the physical address of each Physical Block from the sample obtained by the sampling includes:
      for each sample, traversing each physical address and corresponding logical address recorded in the sample of the logical mapping table according to the increasing order of physical address, and, for each physical address traversed, deciding whether the logical address corresponding to the Physical Block has changed compared to the last sample of the logical mapping table, and
      taking statistics of the change times of the logical address corresponding to each Physical Block in the memory in the current sampling interval.

2. The method of claim 1, wherein, getting the first Physical Block by taking statistics of the degree of wear of each Physical Block in the memory in the current sampling interval comprises:
   recording the change times of the logical address mapped to the physical address of each Physical Block in the current sampling interval in the memory; and
   selecting a Physical Block with the most change times of the logical address as the first Physical Block.

3. The method of claim 1, wherein, getting the first Physical Block by taking statistics the degree of wear of each Physical Block in the memory in the current sampling interval comprises: taking statistics of the change times of the logical address mapped to the physical address of each Physical Block from the sample obtained by the sampling, and selecting at least one Physical Block, the number of change times of the logical address of which reaches a threshold, as the first Physical Block;

getting the second Physical Block by taking statistics of update times of each logical address in the current sampling interval comprises: sampling logical mapping table of the memory in the current sampling interval, wherein the logical mapping table is used for recording mapping relation between logical address and physical address of each Physical Block in the memory; taking statistics of the change times of the physical address mapped to each logical address from the sample obtained by the sampling; and selecting at least one Physical Block corresponding to at least one logical address with the least change times of the physical address respectively as the second Physical Block, wherein the number of Physical Blocks included in the second Physical Block and the number of Physical Blocks included in the first Physical Block are the same; and     wherein exchanging the logical address and data of the first Physical Block and the second Physical Block comprises: matching the at least one first Physical Block with the at least one second Physical Block to obtain at least one pair of Physical Blocks comprising one first Physical Block and one second Physical Block, and exchanging the logical address and data of the first Physical Block and the second Physical Block of the same pair of Physical Blocks.

4. The method of claim 1, wherein, getting the first Physical Block by taking statistics of the degree of wear of each Physical Block in the memory in the current sampling interval comprises: recording the change times of the logical address mapped to the physical address of each Physical Block in the current sampling interval, and selecting at least one Physical Block, the number of change times of the logical address of which reaches a threshold, as the first Physical Block;

getting the second Physical Block by taking of update times of each logical address in the current sampling interval comprises: sampling logical mapping table of the memory in the current sampling interval, wherein the logical mapping table is used for recording mapping relation between logical address and physical address of each Physical Block in the memory; taking statistics of the change times of the physical address mapped to each logical address from the sample obtained by the sampling; and selecting at least one Physical Block corresponding to at least one logical address with the least change times of the physical address respectively as the second Physical Block, wherein the number of Physical Blocks included in the second Physical Block and the number of Physical Blocks included in the first Physical Block are the same; and     wherein exchanging the logical address and data of the first Physical Block and the second Physical Block comprises: matching the at least one first Physical Block with the at least one second Physical Block to obtain at least one pair of Physical Blocks comprising one first Physical Block and one second Physical Block, and exchanging the logical address and data of the first Physical Block and the second Physical Block of the same pair of Physical Blocks.

5. The method of claim 3, wherein, matching the at least one first Physical Block with the at least one second Physical Block to obtain at least one pair of Physical Blocks comprising one first Physical Block and one second Physical Block comprises:

arranging the at least one first Physical Block according to the decreasing change times of the logical address mapped to each physical address of the at least one first Physical Block;

arranging the at least one second Physical Block according to the increasing change times of the physical address mapped to each second Physical Block;

matching one first Physical Block and one second Physical Block of the same order to obtain a pair of Physical Blocks.

6. The method of claim 3, wherein, the method further comprises:

detecting whether the first Physical Block and the second Physical Block are the same Physical Block, before exchanging the logical address and data of the first Physical Block and the second Physical Block of the same pair; and     if yes, the logical address and data of the first Physical Block and the second Physical Block are not exchanged.

7. The method of claim 3, wherein, the method further comprises:

detecting whether the logical address and data of the first Physical Block and the second Physical Block has been exchanged in the current wear leveling process, before exchanging the logical address and data of the first Physical Block and the second Physical Block of the same pair; and     if yes, the logical address and data of the first Physical Block and the second Physical Block are not exchanged.

8. An apparatus for performing wear leveling in a memory, comprising:

a first unit, for dividing life cycle of the memory into at least one sampling interval;

a second unit, for getting a first Physical Block by taking statistics of degree of wear of each Physical Block in the memory in the current sampling interval, and getting a second Physical Block by taking statistics of update times of each logical address in the current sampling interval, with respect to each sampling interval divided by the first unit; and     a third unit, for exchanging the logical address and data of the first Physical Block and the second Physical Block gotten by the second unit,     wherein the second unit samples a logical mapping table of the memory in the current sampling interval, the logical mapping table recording a mapping relation between logical address and physical address of each Physical Block in the memory, takes statistics of the change times of the physical address mapped to each logical address from the sample obtained by the sampling, and selects a Physical Block corresponding to a logical address with the least change times as the second Physical Block,     wherein the second unit takes statistics of the change times of the logical address mapped to the physical address of each Physical Block from the sample obtained by the sampling, and selects the Physical Block with the most change times of the logical address as the first Physical Block, and     wherein, for each sample, the second unit traverses each physical address and corresponding logical address recorded in the sample of the logical mapping table according to the increasing order of physical address, and, for each physical address traversed, decides whether the logical address corresponding to the Physical Block has changed compared to the last sample of the logical mapping table, and takes statistics of the change times of the logical address corresponding to each Physical Block in the memory in the current sampling interval.

9. The apparatus of claim 8, wherein, the apparatus further comprises:
- a fourth unit, for recording the change times of the logical address mapped to the physical address of each Physical Block in the current sampling interval;
- the second unit is further used for taking statistics of the degree of wear based on the change times recorded by the fourth unit.

10. The apparatus of claim 8, wherein, the first Physical Block is the Physical Block with the highest degree of wear, and the second Physical Block is the Physical block corresponding to the logical address with the least update times.

11. The apparatus of claim 8, wherein, the first Physical Block comprises at least one Physical Block, the degree of wear of which reaches a threshold, and the second Physical Block comprises at least one Physical Block corresponding to at least one logical address with the least update times respectively, the number of Physical Blocks included in the second Physical Block and the number of Physical Blocks included in the first Physical Block are the same;
- the third unit is further used for composing at least one pair of Physical Blocks through matching the at least one first Physical Block with the at least one second Physical Block, and exchanging the logical address and data of one first Physical Block and one second Physical Block of the same pair.

12. The apparatus of claim 8, wherein, the memory is a Flash memory.

* * * * *